United States Patent
Zhu et al.

(10) Patent No.: US 9,070,784 B2
(45) Date of Patent: Jun. 30, 2015

(54) METAL GATE STRUCTURE OF A CMOS SEMICONDUCTOR DEVICE AND METHOD OF FORMING THE SAME

(75) Inventors: Ming Zhu, Singapore (SG); Bao-Ru Young, Zhubei (TW); Harry Hak-Lay Chuang, Singapore (SG)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 918 days.

(21) Appl. No.: 13/189,232

(22) Filed: Jul. 22, 2011

(65) Prior Publication Data
US 2013/0020651 A1  Jan. 24, 2013

(51) Int. Cl.
*H01L 21/338* (2006.01)
*H01L 21/8238* (2006.01)

(52) U.S. Cl.
CPC .. *H01L 21/82385* (2013.01); *H01L 21/823864* (2013.01); *H01L 21/823878* (2013.01)

(58) Field of Classification Search
USPC .................. 257/368, 369; 438/183, 188, 199
See application file for complete search history.

(56) References Cited

U.S. PATENT DOCUMENTS

| 2007/0284671 | A1 | 12/2007 | Tsutsumi et al. |
| 2009/0189223 | A1 | 7/2009 | Anderson et al. |
| 2010/0048011 | A1 | 2/2010 | Yeh et al. |
| 2010/0059827 | A1 | 3/2010 | Oosuka et al. |

FOREIGN PATENT DOCUMENTS

| CN | 101819976 | 9/2010 |
| CN | 102034758 | 4/2011 |
| JP | 2008021903 | 1/2008 |
| KR | 20110064477 | 6/2011 |
| KR | 20110095116 | 8/2011 |

OTHER PUBLICATIONS

Office Action dated Mar. 28, 2013 from corresponding application No. KR 10-2012-0036151.
Notice of Allowance dated Sep. 12, 2013 with English translation from corresponding application No. KR 10-2012-0036151.
Office Action dated Jun. 12, 2014 from corresponding application No. TW100136014.

*Primary Examiner* — Ori Nadav
(74) *Attorney, Agent, or Firm* — Lowe Hauptman & Ham, LLP

(57) ABSTRACT

The invention relates to integrated circuit fabrication, and more particularly to a metal gate structure. An exemplary structure for a CMOS semiconductor device comprises a substrate, an N-metal gate electrode, and a P-metal gate electrode. The substrate comprises an isolation region surrounding a P-active region and an N-active region. The N-metal gate electrode comprises a first metal composition over the N-active region. The P-metal gate electrode comprises a bulk portion over the P-active region and an endcap portion over the isolation region. The endcap portion comprises the first metal composition and the bulk portion comprises a second metal composition different from the first metal composition.

20 Claims, 9 Drawing Sheets

METAL GATE STRUCTURE OF A CMOS SEMICONDUCTOR DEVICE AND METHOD OF FORMING THE SAME

FIELD

The disclosure relates to integrated circuit fabrication and, more particularly, to a metal gate structure.

BACKGROUND

As the technology nodes shrink, in some integrated circuit (IC) designs, polysilicon gate electrodes are replaced by metal gate electrodes to improve device performance with the decreased feature sizes. One process of forming a metal gate structure is termed a "gate last" process in which the final gate structure is fabricated "last" which allows for reduced number of subsequent processes, including high temperature processing, that must be performed after formation of the gate.

However, there are challenges to implement such features and processes in complementary metal-oxide-semiconductor (CMOS) fabrication. As the gate length and spacing between devices decrease, these problems are exacerbated. For example, in a "gate last" fabrication process, it is difficult to achieve a perfect isolation between neighboring transistors because unwanted recesses are generated in an inter-layer dielectric (ILD) layer after wet/dry etching a dummy strip. The recesses present in the ILD layer can become a receptacle of metals during subsequent processing thereby increasing the likelihood of electrical shorting and/or device failure.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features in the drawings may be arbitrarily increased or reduced for clarity of discussion.

DESCRIPTION

Figure 1:
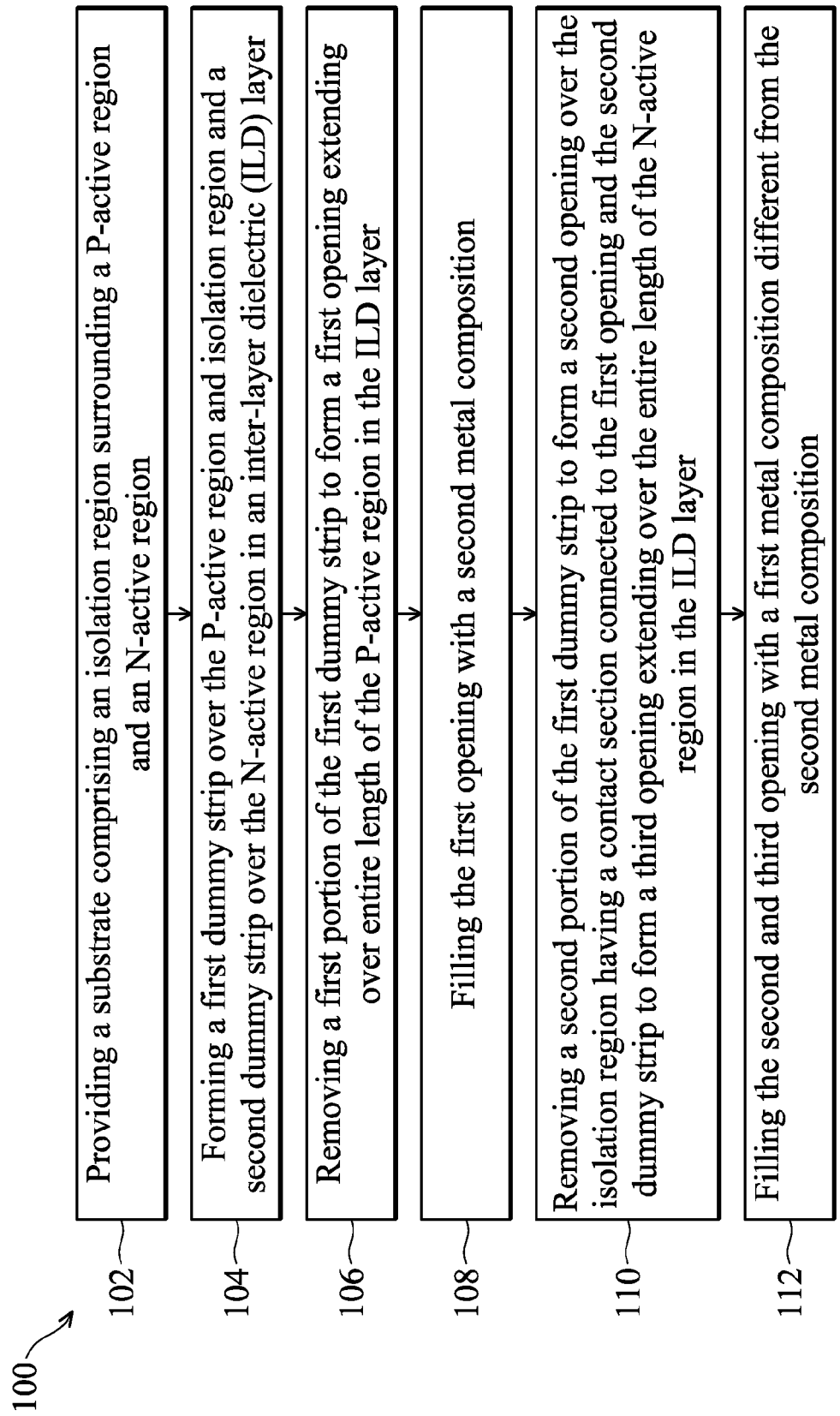
FIG. 1 is a flowchart of a method of fabricating a CMOS semiconductor device comprising a metal gate structure according to various aspects of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity. Further, the present disclosure may repeat reference numerals and/or letters in the various examples. This repetition is for the purpose of simplicity and clarity and does not in itself dictate a relationship between the various embodiments and/or configurations discussed. In addition, the present disclosure provides examples of a "gate last" metal gate process, however, one skilled in the art may recognize applicability to other processes and/or use of other materials.

Figure 2:
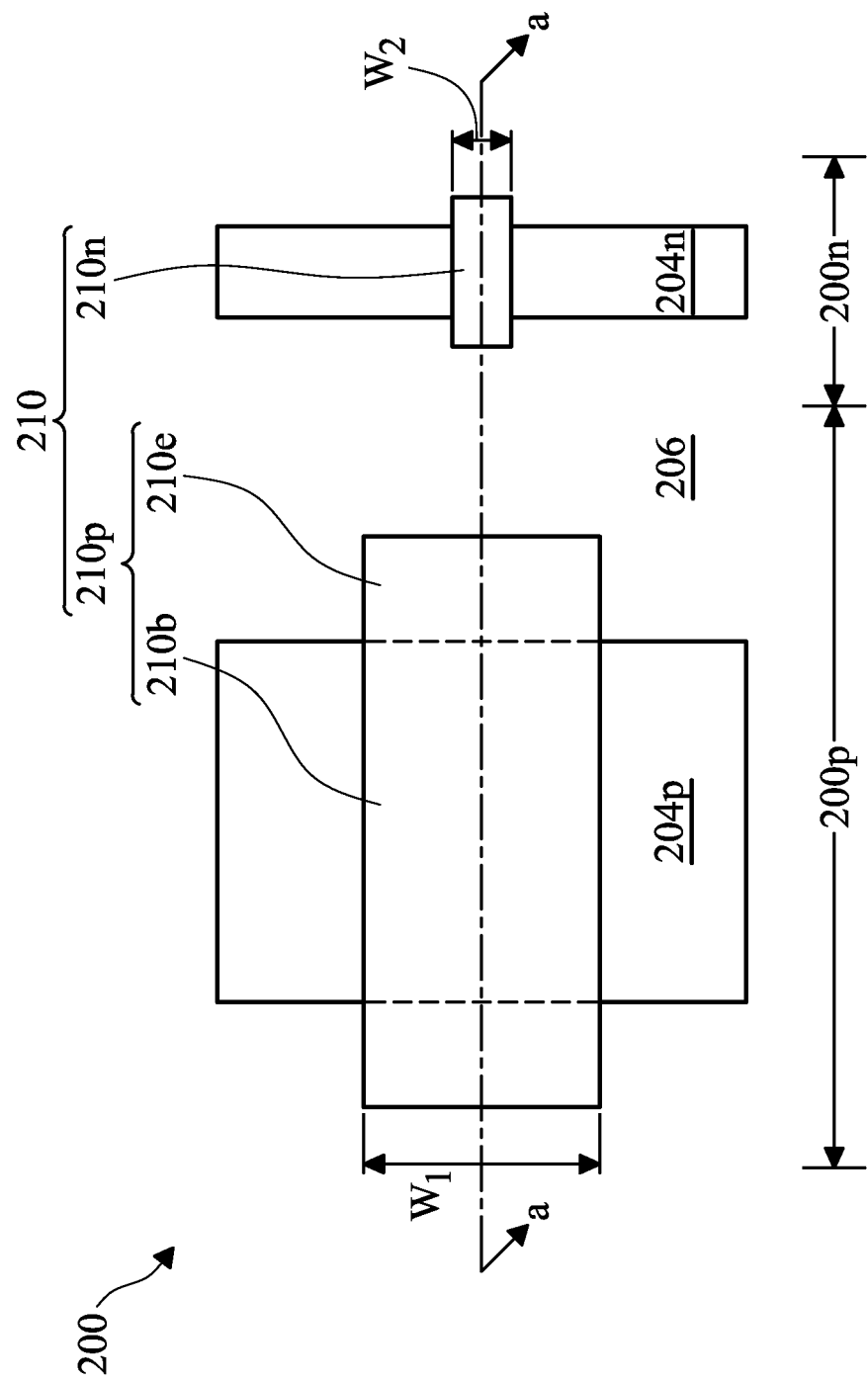
FIG. 2 is a top view of a CMOS semiconductor device comprising a metal gate structure according to various aspects of the present disclosure.

FIG. 1 is a flowchart of a method 100 of fabricating a complementary metal-oxide-semiconductor (CMOS) semiconductor device 200 comprising a metal gate structure 210 (shown in FIG. 2) according to various aspects of the present disclosure. FIG. 2 is a top view of a CMOS semiconductor device 200 comprising a metal gate structure 210 according to various aspects of the present disclosure; and FIGS. 3A-3F are cross-section views of a CMOS semiconductor device 200 taken along the line a-a of FIG. 2 at various stages of fabrication according to various aspects of the present disclosure. It is noted that part of the CMOS semiconductor device 200 may be fabricated with CMOS technology processing. Accordingly, it is understood that additional processes may be provided before, during, and/or after the method 100 of FIG. 1, and that some other processes may only be briefly described herein. Also, FIGS. 1 through 3F are simplified for a better understanding of the present disclosure. For example, although the figures illustrate a metal gate structure 210 for the CMOS semiconductor device 200, it is understood the CMOS semiconductor device 200 may be part of an integrated circuit (IC) that may comprise a number of other devices comprising resistors, capacitors, inductors, fuses, etc.

FIG. 2 is a top view of a CMOS semiconductor device 200 comprising a metal gate structure 210 fabricated by a "gate last" process. A substrate 202 (shown in FIG. 3A) comprising an isolation region 206 surrounding a P-active region 204$p$ and an N-active region 204$n$ is provided. The CMOS semiconductor device 200 comprises a p-type metal oxide semiconductor field effect transistor (pMOSFET) 200$p$ and an n-type metal oxide semiconductor field effect transistor (nMOSFET) 200$n$.

The nMOSFET 200$n$ is formed from an N-metal gate electrode 210$n$ comprising a first metal composition 210$f$ over the N-active region 204$n$. In one embodiment, the first metal composition 210$f$ may comprise an N-work-function metal. In some embodiment, the N-work-function metal comprises Ti, Ag, Al, TiAl, TiAlN, TaC, TaCN, TaSiN, Mn, or Zr. In the present embodiment, the N-metal gate electrode 210$n$ over the N-active region 204$n$ has a second width $W_2$ in the range of about 10 to 30 nm and extends outside of the N-active region 204$n$ over the isolation regions 206.

The pMOSFET 200$p$ is formed from a P-metal gate electrode 210$p$ comprising a bulk portion 210$b$ over the P-active region 204$p$ and an endcap portion 210$e$ over the isolation region 206, wherein the endcap portion 210$e$ comprises the first metal composition 210$f$ and the bulk portion 210$b$ comprises a second metal composition 210$s$ different from the first metal composition 210$f$. In at least one embodiment, the second metal composition 210$s$ may comprise a P-work-function metal. In some embodiment, the P-work-function metal comprises TiN, WN, TaN, or Ru. In the present embodiment, the P-metal gate electrode 210$p$ over the P-active region 204$p$ has a first width $W_1$ in the range of about 500 to 1000 nm, so that the first width $W_1$ of the P-metal gate electrode 210$p$ is greater than the second width $W_2$ of the N-metal gate electrode 210$n$. In at least one embodiment, a ratio of the first width $W_1$ to the second width $W_2$ is from about 18 to 30. The P-metal gate electrode 210p and N-metal gate electrode 210n are combined and hereinafter referred to as a metal gate structure 210.

Figure 3A:
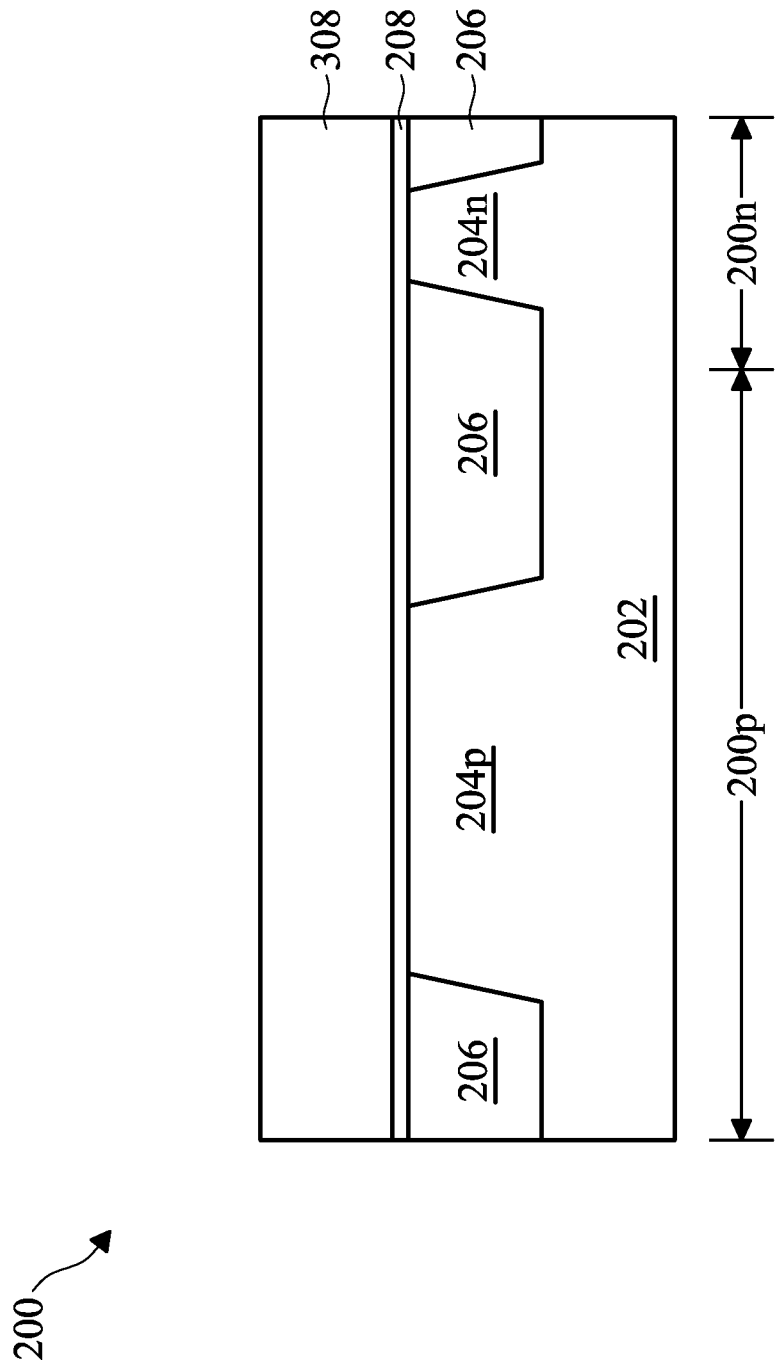
FIGS. 3A-3F are cross-section views of a CMOS semiconductor device taken along the line a-a of FIG. 2 at various stages of fabrication according to various aspects of the present disclosure.

Referring to FIGS. 1 and 3A, the method 100 begins at step 102 wherein a substrate 202 comprising the isolation region 206 surrounding the P-active region 204p and N-active region 204n is provided. The substrate 202 may comprise a silicon substrate. The substrate 202 may alternatively comprise silicon germanium, gallium arsenic, or other suitable semiconductor materials. The substrate 202 may further comprise other features such as various doped regions, a buried layer, and/or an epitaxy layer. Furthermore, the substrate 202 may be a semiconductor on insulator such as silicon on insulator (SOI). In other embodiments, the semiconductor substrate 202 may comprise a doped epi layer, a gradient semiconductor layer, and/or may further include a semiconductor layer overlying another semiconductor layer of a different type such as a silicon layer on a silicon germanium layer. In other examples, a compound semiconductor substrate may comprise a multilayer silicon structure or a silicon substrate may include a multilayer compound semiconductor structure.

In the present embodiments, the semiconductor substrate 202 may comprise the isolation region 206 surrounding the P-active region 204p for the pMOSFET 200p and N-active region 204n for the nMOSFET 200n. The active regions 204p, 204n may include various doping configurations depending on design requirements. For example, the P-active region 204p is doped with n-type dopants, such as phosphorus or arsenic; the N-active region 204n is doped with p-type dopants, such as boron or $BF_2$.

Isolation regions 206 may be formed on the substrate 202 to isolate the various active regions 204p, 204n from each other. The isolation regions 206 may utilize isolation technology, such as local oxidation of silicon (LOCOS) or shallow trench isolation (STI), to define and electrically isolate the various active regions 204p, 204n. In the present embodiment, the isolation region 206 comprises a STI. The isolation regions 206 may comprise materials such as silicon oxide, silicon nitride, silicon oxynitride, fluoride-doped silicate glass (FSG), a low dielectric constant (low-k) dielectric material, and/or combinations thereof. The isolation regions 206, and in the present embodiment, the STI, may be formed by any suitable process. As one example, the formation of the STI may include patterning the semiconductor substrate 202 by a photolithography process, etching a trench in the substrate 202 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Still referring to FIG. 3A, a gate dielectric layer 208 may be formed over the substrate 202. In some embodiments, the gate dielectric layer 208 may comprise silicon oxide, silicon nitride, silicon oxy-nitride, or high dielectric constant (high-k) dielectric. High-k dielectrics comprise certain metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, or mixtures thereof. In the present embodiment, the gate dielectric layer 208 is a high-k dielectric layer comprising $HfO_x$ with a thickness in the range of about 10 to 30 angstroms. The gate dielectric layer 208 may be formed using a suitable process such as atomic layer deposition (ALD), chemical vapor deposition (CVD), physical vapor deposition (PVD), thermal oxidation, ultraviolet (UV)-ozone oxidation, or combinations thereof. The gate dielectric layer 208 may further comprise an interfacial layer (not shown) to reduce damage between the gate dielectric layer 208 and the substrate 202. The interfacial layer may comprise silicon oxide.

In a gate last process, a dummy gate electrode layer 308 is subsequently formed over the gate dielectric layer 208. In some embodiments, the dummy gate electrode layer 308 may comprise a single layer or multilayer structure. In the present embodiment, the dummy gate electrode layer 308 may comprise poly-silicon. Further, the dummy gate electrode layer 308 may be doped poly-silicon with the uniform or gradient doping. The dummy gate electrode layer 308 may have a thickness in the range of about 30 nm to about 60 nm. The dummy electrode layer 308 may be formed using a low-pressure chemical vapor deposition (LPCVD) process. In at least one embodiment, the LPCVD process can be carried out in a standard LPCVD furnace at a temperature of about 580° C. to 650° C., and at a pressure of about 200 mTorr to 1 Torr, using silane ($SiH_4$) or dichlorosilane ($SiH_2Cl_2$) as the silicon source gas.

Figure 3B:
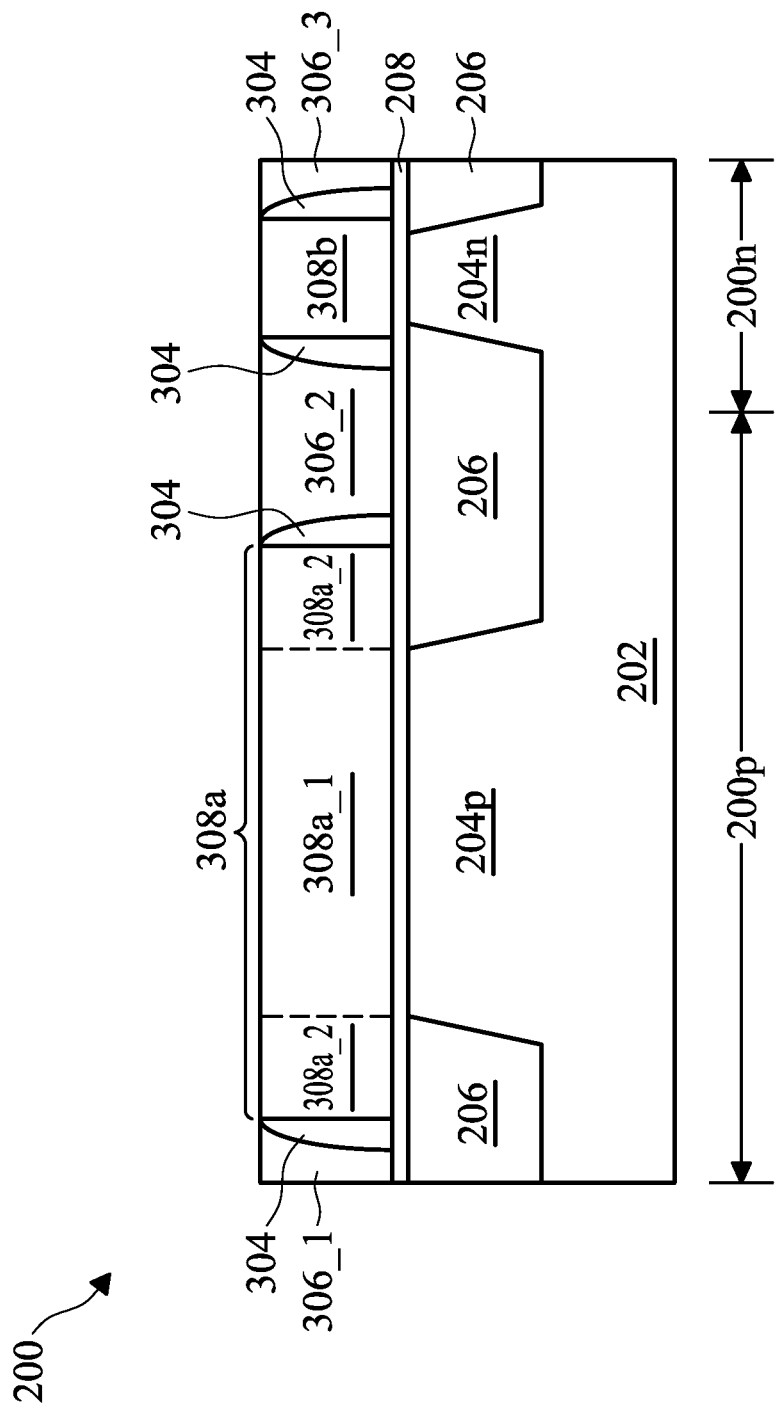

The method 100 in FIG. 1 continues with step 104 in which the structure in FIG. 3B is produced by forming a first dummy strip 308a over the P-active region 204p and isolation region 206 and a second dummy strip 308b over the N-active region 204n in an inter-layer dielectric (ILD) layer 306.

In the present embodiment, a layer of photoresist (not shown) is formed over the dummy gate electrode layer 308 by a suitable process, such as spin-on coating, and patterned to form a patterned photoresist feature over the dummy gate electrode layer 308 by a proper lithography patterning method. In at least one embodiment, a width of the patterned photoresist feature over the P-active region 204p and isolation region 206 is in the range of about 500 to 1000 nm. In another embodiment, a width of the patterned photoresist feature over the N-active region 204n is in the range of about 10 to 30 nm. The patterned photoresist feature can then be transferred using a dry etching process to the dummy gate electrode layer 308 to form a first dummy strip 308a over the P-active region 204p and isolation region 206 and a second dummy strip 308b over the N-active region 204n. The photoresist layer may be stripped thereafter.

It is noted that the CMOS semiconductor device 200 may undergo other "gate last" processes and other CMOS technology processing to form various features of the CMOS semiconductor device 200. As such, the various features are only briefly discussed herein. The various components of the CMOS semiconductor device 200 may be formed prior to formation of the P-metal gate electrode 210p and N-metal gate electrode 210n in a "gate last" process. The various components may comprise p-type and n-type lightly doped source/drain (LDD) regions (not shown) and p-type and n-type source/drain (S/D) regions (not shown) in the active regions 204p, 204n and on opposite sides of the first dummy strip 308a and second dummy strip 308b. The p-type LDD and S/D regions may be doped with B or In, and the n-type LDD and S/D regions may be doped with P or As.

Then, a dielectric layer is formed over the P-active region 204p, N-active region 204n, and isolation region 206 to produce the structure shown in FIG. 3B. The dielectric layer may comprise a single layer or multilayer structure. In at least one embodiment, the dielectric layer is patterned to form gate spacers 304 on opposite sidewalls of the first dummy strip 308a and the second dummy strip 308b. The gate spacers 304 may be formed of silicon oxide, silicon nitride or other suitable materials deposited by a CVD process.

Then, an inter-layer dielectric (ILD) material may be formed over the gate spacers 304, first dummy strip 308a, second dummy strip 308b, and isolation region 206. The ILD layer material may include an oxide formed by a high-aspect-ratio process (HARP) and/or a high-density-plasma (HDP) deposition process. After the ILD layer material deposition, a chemical mechanical polishing (CMP) is performed on the ILD layer material deposition to expose the first dummy strip 308a and second dummy strip 308b.

In the present embodiment, the remaining ILD layer material after performing the CMP process comprises a first portion 306_1 and a second portion 306_2 surrounding the first dummy strip 308a over the P-active region 204p and isolation region 206. In addition, the remaining ILD layer material comprises the second portion 306_2 and a third portion 306_3 surrounding the second dummy strip 308b over the N-active region 204n. Thus, the first dummy strip 308a over the P-active region 204p and isolation region 206 and the second dummy strip 308b over the N-active region 204n together define an ILD layer 306. Further, the first dummy strip 308a comprises a first portion 308a_1 and a second portion 308a_2.

Figure 3C:
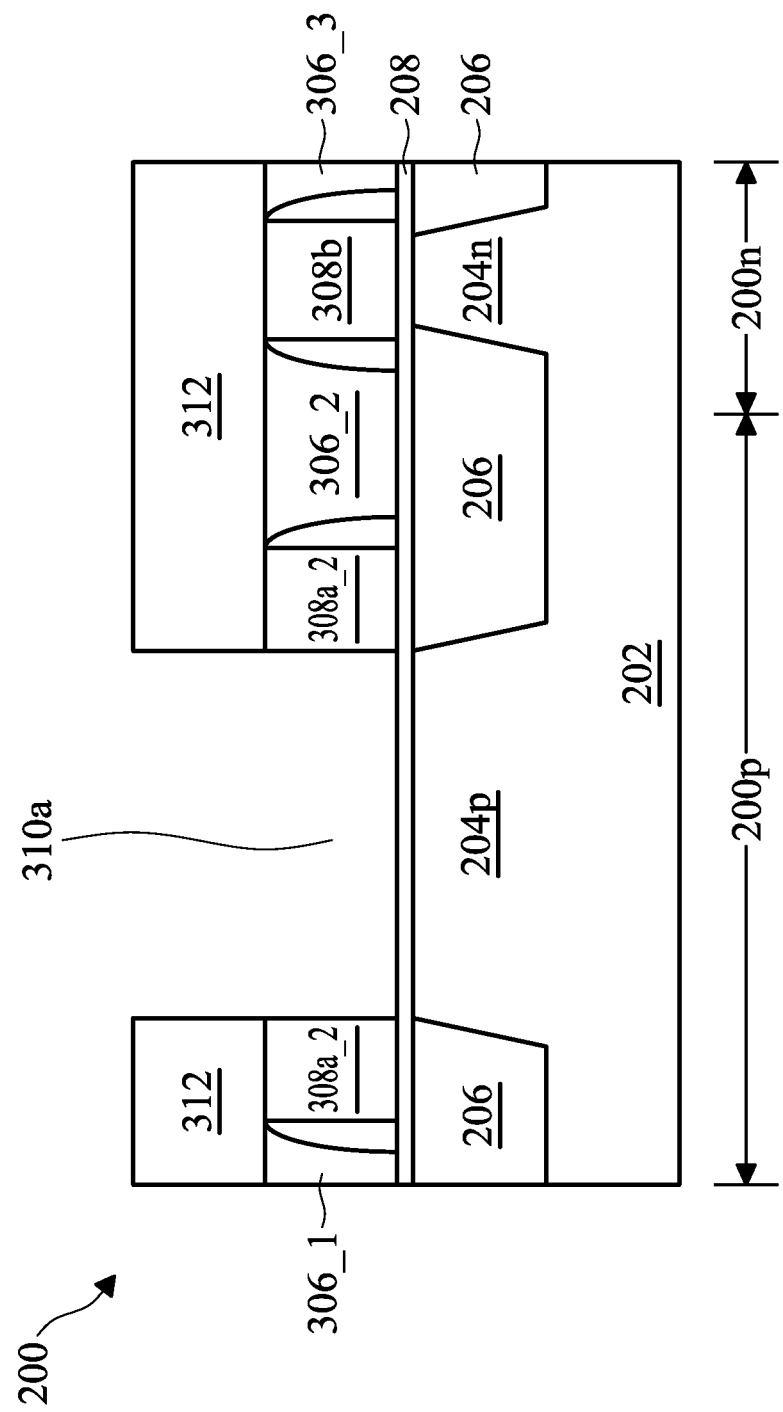

The method 100 in FIG. 1 continues with step 106 in which the structure in FIG. 3C is produced by removing the first portion 308a_1 of the first dummy strip 308a to form a first opening 310a extending over entire length of the P-active region 204a in the ILD layer 306. In the present embodiment, using a patterned photoresist layer 312 as a mask, the first portion 308a_1 of the first dummy strip 308a is removed to form the first opening 310a in the first dummy strip 308a, while a second portion 308a_2 of the first dummy strip 308a, the second dummy strip 308b, and ILD layer 306 are covered by the patterned photoresist layer 312. In the present embodiment, the first opening 310a has the first width $W_1$ in the range of about 500 to 1000 nm.

In at least one embodiment, the first portion 308a_1 of the first dummy strip 308a may be removed using a dry etch process. In at least one embodiment, the dry etch process may be performed under a source power of about 650 to 800 W, a bias power of about 100 to 120 W, and a pressure of about 60 to 200 mTorr, using $Cl_2$, HBr, and/or He as etching gases. The patterned photoresist layer 312 may be stripped thereafter.

It should be noted that the dry etching process for removing the first portion 308a_1 of first dummy strip 308a is especially prone to simultaneously removing a top portion of the ILD layer 306_1/306_2 adjacent to the first dummy strip 308a. Thus, if recesses are generated in the ILD layer 306_1/306_2 after dry etching the first portion 308a_1 of the first dummy strip 308a, the recesses present in the ILD layer 306_1/306_2 can become a receptacle of metals during subsequent processing thereby increasing the likelihood of electrical shorting and/or device failure.

In the present embodiment, the ILD layer 206 is covered and protected by the patterned photoresist layer 312 while removing the first portion 308a_1 of the first dummy strip 308a. The remaining second portion 308a_2 of the first dummy strip 308a adjacent to the ILD layer 306_1/306_2 may further protect the ILD layer 306_1/306_2 during a metal CMP process in next step 108. Accordingly, Applicant's method of fabricating a CMOS semiconductor device 200 may fabricate the gate structure 210 having almost no recess in the ILD layer 306_1/306_2, thereby achieving a perfect isolation between neighboring transistors and thus enhancing the device performance.

Figure 3D:
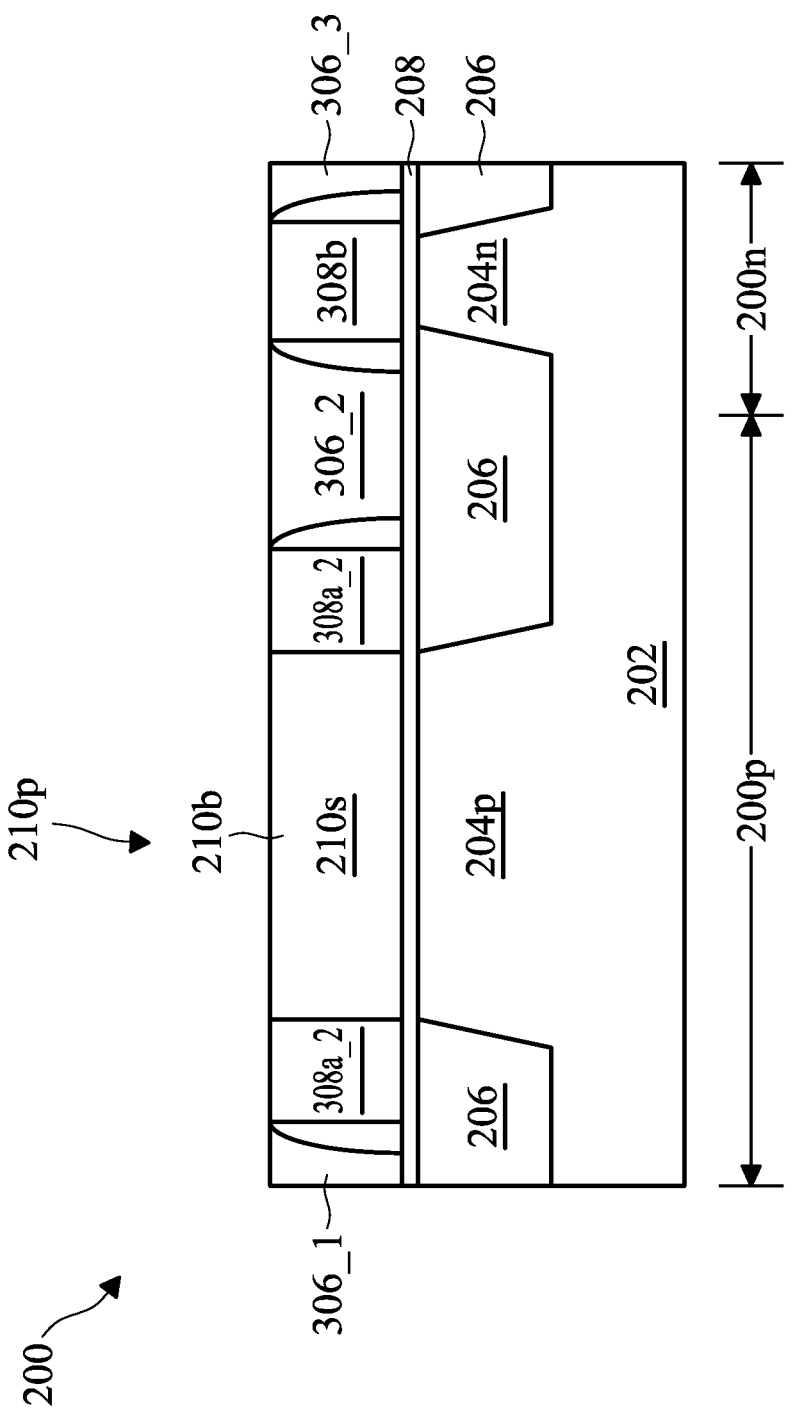

The method 100 in FIG. 1 continues with step 108 in which the structure in FIG. 3D is produced by filling the first opening 310a with the second metal composition 210s. In at least one embodiment, the second metal composition 210s may comprise a P-work-function metal. In some embodiments, the P-work-function metal comprises TiN, WN, TaN, or Ru. The P-work-function metal may be formed by ALD, CVD or other suitable technique. In the present embodiment, the second metal composition 210s is first deposited to substantially fill the first opening 310p. Then, a CMP process is performed to remove a portion of the second metal composition 210s outside of the first opening 310a. Accordingly, the CMP process may stop when reaching the ILD layer 306, and thus providing a substantially planar surface. The remaining second metal composition 210s is referred to as the bulk portion 210b of the P-metal gate electrode 210p.

Figure 3E:
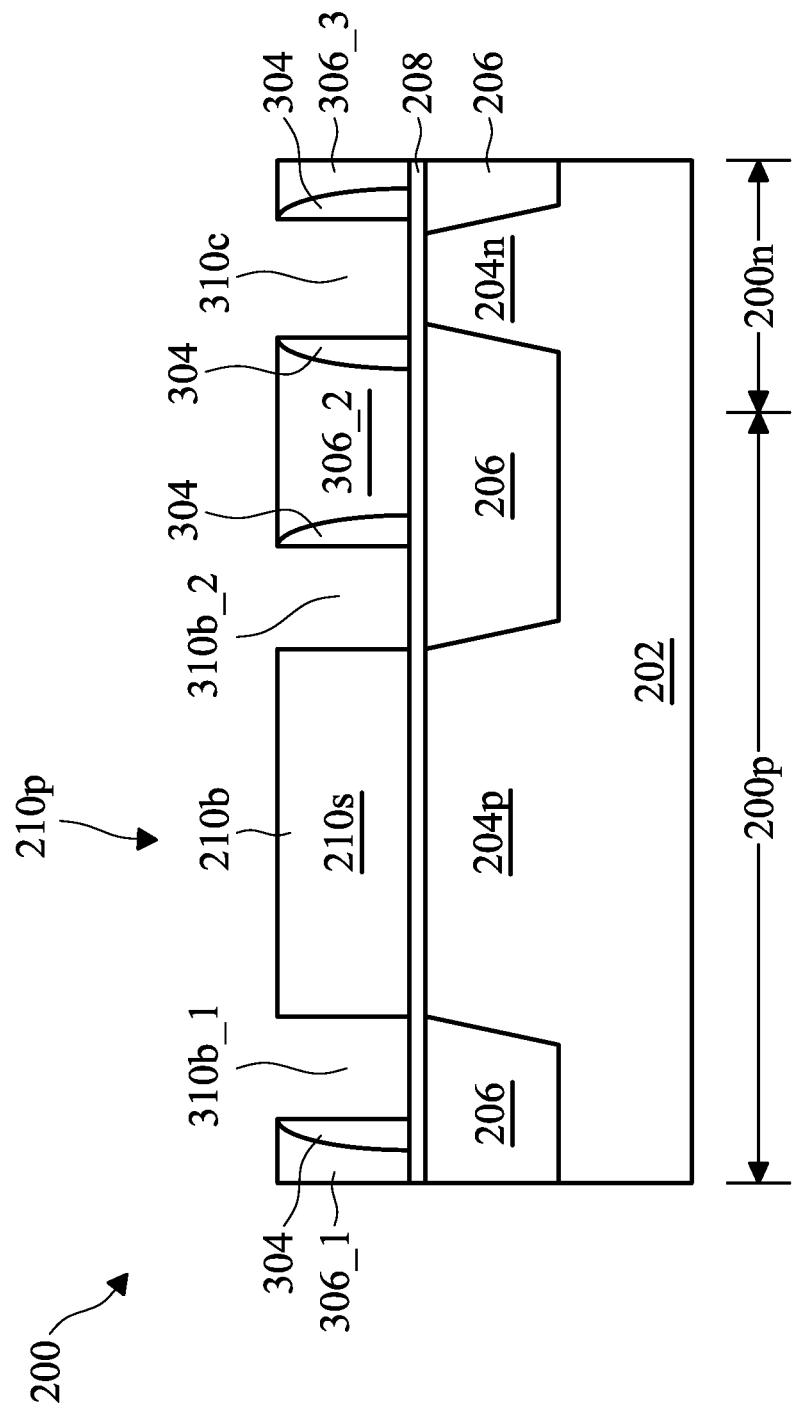

The method 100 in FIG. 1 continues with step 110 in which the structure in FIG. 3E is produced by removing a second portion 308a_2 of the first dummy strip 308a to form a second opening 310b (donated as 310b_1 and 310b_2) over the isolation region 206 and by removing the second dummy strip 308b to form a third opening 310c extending over the entire length of the N-active region 204n in the ILD layer 306.

In the present embodiment, using the gate spacers 304, ILD layer 306 and bulk portion 210b of the P-metal gate electrode 210p as hard masks, the second portion 308a_2 of the first dummy strip 308a and the second dummy strip 308b are simultaneously removed to form the second and third openings 310b, 310c in the ILD layer 306. In at least one embodiment, the second opening 310b has almost the same first width $W_1$ of the first opening 310a. In another embodiment, the third opening 310c has a second width $W_2$ in the range of about 10 to 30 nm, less than the first width $W_1$ of the first opening 310a. A ratio of the first width $W_1$ to the second width $W_2$ is from about 18 to 30.

In some embodiments, the second dummy strip 308b and second portion 308a_2 of the first dummy strip 308a may be removed using a wet etch and/or a dry etch process. In at least one embodiment, the wet etch process includes exposure to a hydroxide solution containing ammonium hydroxide, diluted HF, deionized water, and/or other suitable etchant solutions. In another embodiment, the dry etch process may be performed under a source power of about 650 to 800 W, a bias power of about 100 to 120 W, and a pressure of about 60 to 200 mTorr, using $Cl_2$, HBr and He as etching gases.

Figure 3F:
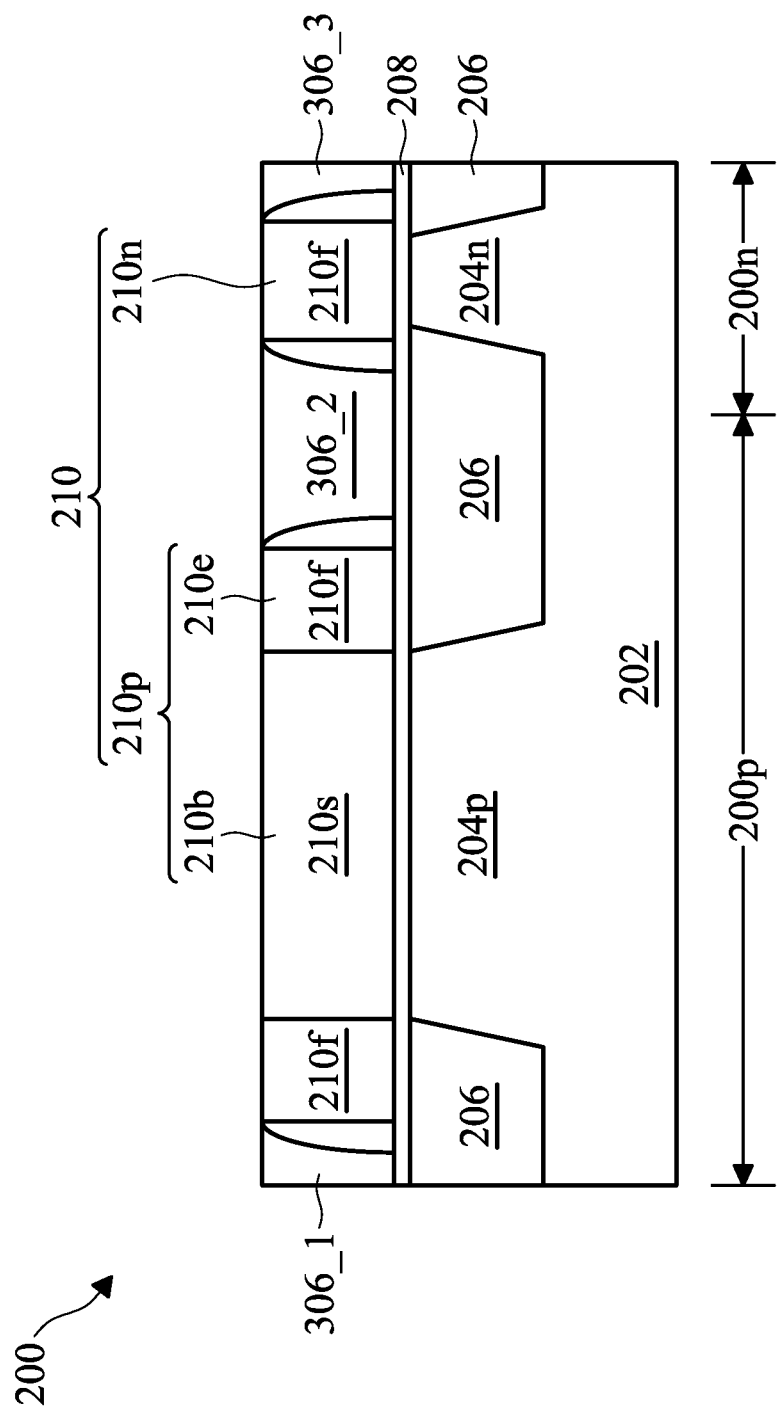

The method 100 in FIG. 1 continues with step 112 in which the structure in FIG. 3F is produced by filling the second and third openings 310b, 310c with the first metal composition 210f. In one embodiment, the first metal composition 210f may comprise an N-work-function metal. In some embodiments, the N-work-function metal comprises Ti, Ag, Al, TiAl, TiAlN, TaC, TaCN, TaSiN, Mn, or Zr. The N-work-function metal may be formed by ALD, PVD, sputtering or other suitable technique. In the present embodiment, the first metal composition 210f is first deposited to substantially fill the second and third openings 310b, 310c. Then, a CMP process is performed to remove a portion of the first metal composition 210f outside of the second and third openings 310b, 310c. Accordingly, the CMP process may stop when reaching the ILD layer 306, and thus providing a substantially planar surface.

In some embodiments, the remaining first metal composition 210f in the second opening 310b over the isolation region 206 is referred to as the endcap portion 210e of the P-metal gate electrode 210p. In the present embodiment, the endcap portion 210e of the P-metal gate electrode 210p has a contact section connected to the bulk portion 210b of the P-metal gate electrode 210p. In the present embodiment, the endcap portion 210e of the P-metal gate electrode 210p and the bulk portion 210b of the P-metal gate electrode 210p are combined and referred to as the P-metal gate electrode 210p. In some embodiments, the remaining first metal composition 210f in the third opening 310c is referred to as the N-metal gate electrode 210n. The P-metal gate electrode 210p and N-metal gate electrode 210n are combined and referred to as a metal gate structure 210.

Figure 4:
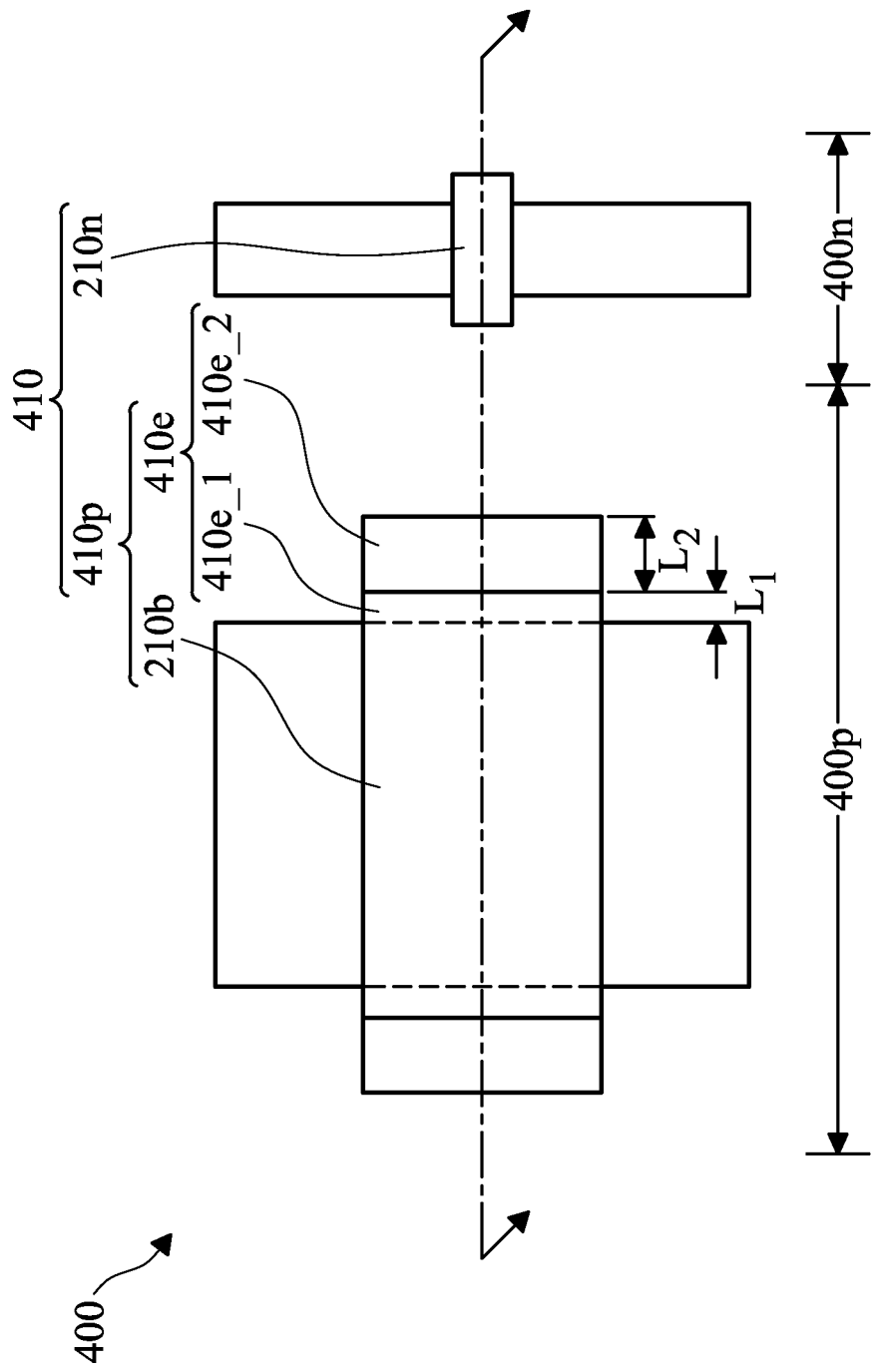
FIG. 4 is a top view of a CMOS semiconductor device comprising a metal gate structure according to various aspects of the present disclosure.

FIG. 4 is a top view of an alternate CMOS semiconductor device 400 comprising a metal gate structure 410 according to various aspects of the present disclosure fabricated using a method comprising the steps shown in FIG. 3A-F, except that the first opening 310a further extends into the isolation region 306 to form an extending portion. Similar features in FIGS. 2 and 4 are numbered the same for the sake of simplicity and clarity. In the present embodiment, the endcap portion 410e comprises a second portion 410e_2 and a first portion 410e_1 between the second portion 410e_2 and the bulk portion 210b, wherein the second portion 410e_2 comprises the first metal composition 210f. A first length $L_1$ of the first portion 410e_1 is equal to or less than a second length $L_2$ of the second portion 410e_2. A ratio of the second length $L_2$ to the first length $L_1$ is from about 1.0 to 1.5.

In the present embodiment, the endcap portion 410e of the P-metal gate electrode 410p and the bulk portion 210b of the P-metal gate electrode 410p are combined and referred to as the P-metal gate electrode 410p. The P-metal gate electrode 410p and N-metal gate electrode 210n are combined and referred to as a metal gate structure 410.

It is understood that the CMOS semiconductor devices 200, 400 may undergo further CMOS processes to form various features such as contacts/vias, interconnect metal layers, dielectric layers, passivation layers, etc.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a CMOS semiconductor device comprising:
    forming a first dummy strip and a second dummy strip over a substrate, the first dummy strip is formed over a P-active region and an isolation region of the substrate, the second dummy strip is formed over an N-active region of the substrate, the first dummy strip and the second dummy strip are separated by a space over the isolation region;
    forming an inter-layer dielectric (ILD) layer over the substrate in the space between the first dummy strip and the second dummy strip;
    removing a first portion of the first dummy strip to form a first opening extending over an entire length of the P-active region, leaving a second portion of the first dummy strip over the isolation region;
    filling the first opening with a first metal composition;
    removing the second portion of the first dummy strip to form a second opening over the isolation region;
    removing the second dummy strip to form a third opening extending over the entire length of the N-active region; and
    filling the second opening and the third opening with a second metal composition different from the first metal composition.

2. The method of claim 1, wherein the first opening further extends over a portion of the isolation region.

3. The method of claim 1, wherein the first opening is filled with the first metal composition using an atomic layer deposition (ALD) process.

4. The method of claim 1, wherein the second opening and the third opening are with the second metal composition using a physical vapor deposition (PVD) process.

5. The method of claim 1, wherein a first width of the first opening is greater than a second width of the third opening.

6. The method of claim 5, wherein a ratio of the first width to the second width is from about 18 to 30.

7. The method of claim 1, wherein the second metal composition comprises an N-work-function metal.

8. The method of claim 7, wherein the N-work-function metal comprises Ti, Ag, Al, TiAl, TiAlN, TaC, TaCN, TaSiN, Mn, or Zr.

9. The method of claim 1, wherein the second metal composition comprises a P-work-function metal.

10. The method of claim 9, wherein the P-work-function metal comprises TiN, WN, TaN, or Ru.

11. A method of fabricating a CMOS semiconductor device, comprising:
    forming a gate dielectric layer over a substrate, the substrate comprising an isolation region surrounding a P-active region and an N-active region;
    forming a dummy gate electrode layer over the gate dielectric layer;
    patterning the dummy gate electrode layer to form a first dummy strip over the P-active region and isolation region and a second dummy strip over the N-active region;
    removing a first portion of the first dummy strip to form a first opening exposing at least a portion of the P-active region;
    filling the first opening with a first material;
    removing a second portion of the first dummy strip to form a second opening abutting the first material, the second opening exposing at least a portion of the isolation region with the first material abutting the second opening comprising a sidewall substantially aligned with a sidewall of the isolation region;
    removing the second dummy strip to form a third opening; and
    filling the second opening and the third opening with a second material,
    the second material being a first metal composition, and the first material being a second metal composition different from the first metal composition.

12. The method of claim 11, wherein the first opening further exposes another portion of the isolation region.

13. The method of claim 11, wherein the first opening is filled with the first material using an atomic layer deposition (ALD) process.

14. The method of claim 11, wherein the second opening and the third opening are filled with the second material using a physical vapor deposition (PVD) process.

15. The method of claim 11, wherein the first metal composition comprises an N-work-function metal.

16. The method of claim 15, wherein the N-work-function metal comprises Ti, Ag, Al, TiAl, TiAlN, TaC, TaCN, TaSiN, Mn, or Zr.

17. The method of claim 11, wherein the second metal composition comprises a P-work-function metal.

18. The method of claim 17, wherein the P-work-function metal comprises TiN, WN, TaN, or Ru.

19. A method of fabricating a semiconductor device, comprising:
- forming a gate dielectric layer over a substrate, the substrate comprising an isolation region surrounding a P-active region;
- forming a dummy gate electrode layer over the gate dielectric layer;
- patterning the dummy gate electrode layer to form a dummy strip over the P-active region and isolation region;
- removing a first portion of the dummy strip to form a first opening exposing at least a portion of the P-active region;
- filling the first opening with a P-work-function metal;
- removing a second portion of the first dummy strip to form a second opening abutting the P-work-function metal, the second opening exposing at least a portion of the isolation region with the first material abutting the second opening comprising a sidewall substantially aligned with a sidewall of the isolation region; and
- filling the second opening with an N-work-function metal.

20. The method of claim 19, wherein
- the first opening is filled with the P-work-function metal using an atomic layer deposition (ALD) process; and
- the second opening is filled with the N-work-function metal using a physical vapor deposition (PVD) process.

* * * * *